(12) United States Patent
Ilkov (10) Patent No.: US 7,868,683 B2
(45) Date of Patent: Jan. 11, 2011

(54) SWITCH USING AN ACCELERATING ELEMENT

(75) Inventor: Nikolay Ilkov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 22 days.

(21) Appl. No.: 12/190,399

(22) Filed: Aug. 12, 2008

(65) Prior Publication Data

US 2010/0039160 A1    Feb. 18, 2010

(51) Int. Cl.
H03K 17/04    (2006.01)
(52) U.S. Cl. .................. 327/374; 327/376; 327/377
(58) Field of Classification Search ............. 327/374, 327/376, 377; 333/81 R, 103
See application file for complete search history.

(56) References Cited

U.S. PATENT DOCUMENTS

| | | | |
|---|---|---|---|
| 5,828,141 A * | 10/1998 | Foerster ................. | 307/125 |
| 6,804,502 B2 | 10/2004 | Burgener et al. | |
| 7,123,898 B2 | 10/2006 | Burgener et al. | |
| 7,248,120 B2 | 7/2007 | Burgener et al. | |
| 7,427,894 B2 * | 9/2008 | Dow et al. ................. | 330/51 |
| 7,554,385 B2 * | 6/2009 | Ishida ..................... | 327/536 |
| 2006/0194567 A1 | 8/2006 | Kelly et al. | |
| 2006/0270367 A1 | 11/2006 | Burgener et al. | |
| 2007/0018247 A1 | 1/2007 | Brindle et al. | |

FOREIGN PATENT DOCUMENTS

| | | |
|---|---|---|
| JP | 59-006624 | 1/1984 |
| JP | 61-040075 | 2/1986 |
| JP | 05-252014 | 9/1993 |

* cited by examiner

Primary Examiner—Kenneth B. Wells
(74) Attorney, Agent, or Firm—Slater & Matsil, L.L.P.

(57) ABSTRACT

A switch includes a switching transistor, a switching resistor, connected between a control terminal of the switching transistor and a switching control terminal, and an accelerating element. The accelerating element includes a resistance smaller than a resistance of the switching resistor, the accelerating element being adapted to be connected in parallel to the switching resistor upon switching of the switching transistor until a voltage at the control terminal of the switching transistor has reached a predetermined value.

25 Claims, 7 Drawing Sheets

SWITCH USING AN ACCELERATING ELEMENT

BACKGROUND

Embodiments of the invention relate to a switch comprising a switching transistor, a switching resistor and an accelerating element.

SUMMARY OF THE INVENTION

Embodiments of the invention provide a switch, comprising a switching transistor, a switching resistor connected between a control terminal of the switching transistor and a switching control terminal and an accelerating element comprising a resistance smaller than a resistance of the switching resistor, the accelerating element being adapted to be connected in parallel to the switching resistor upon switching of the switching transistor until a voltage at the control terminal of the switching transistor has reached a predetermined value.

DETAILED DESCRIPTION OF ILLUSTRATIVE EMBODIMENTS

Switches, particularly switches for switching radio frequency (RF) signals within integrated circuits, are applied in wireless communications, satellites and cable television. Switch circuits may comprise RF CMOS (radio frequency complementary metal oxide semiconductor) devices, which may be used for high power applications.

The high power RF CMOS switches may have limitations regarding the switching time which may be in the range of several microseconds due to the use of high ohmic resistors necessary to isolate the large amplitude RF signal present at the gates from the output of the gate driver circuits. Although fine for static switching, many applications require a switching time in the range of tens or hundreds of nanoseconds. The large time constant of the high ohmic resistors together with the large gate capacitance of the switching transistors defines the long switching time. Usually this can be improved by reducing the gate length thereby reducing the gate capacitance. However, reducing the value of the gate resistors may only be possible if enough margin in the RF insertion loss and linearity is available, which is often not possible due to technology limitations.

Therefore a need exists for improving the switching time without reducing the gate capacitance of the switching transistor or without changing the semiconductor design of the switching transistors.

Figure 1A:
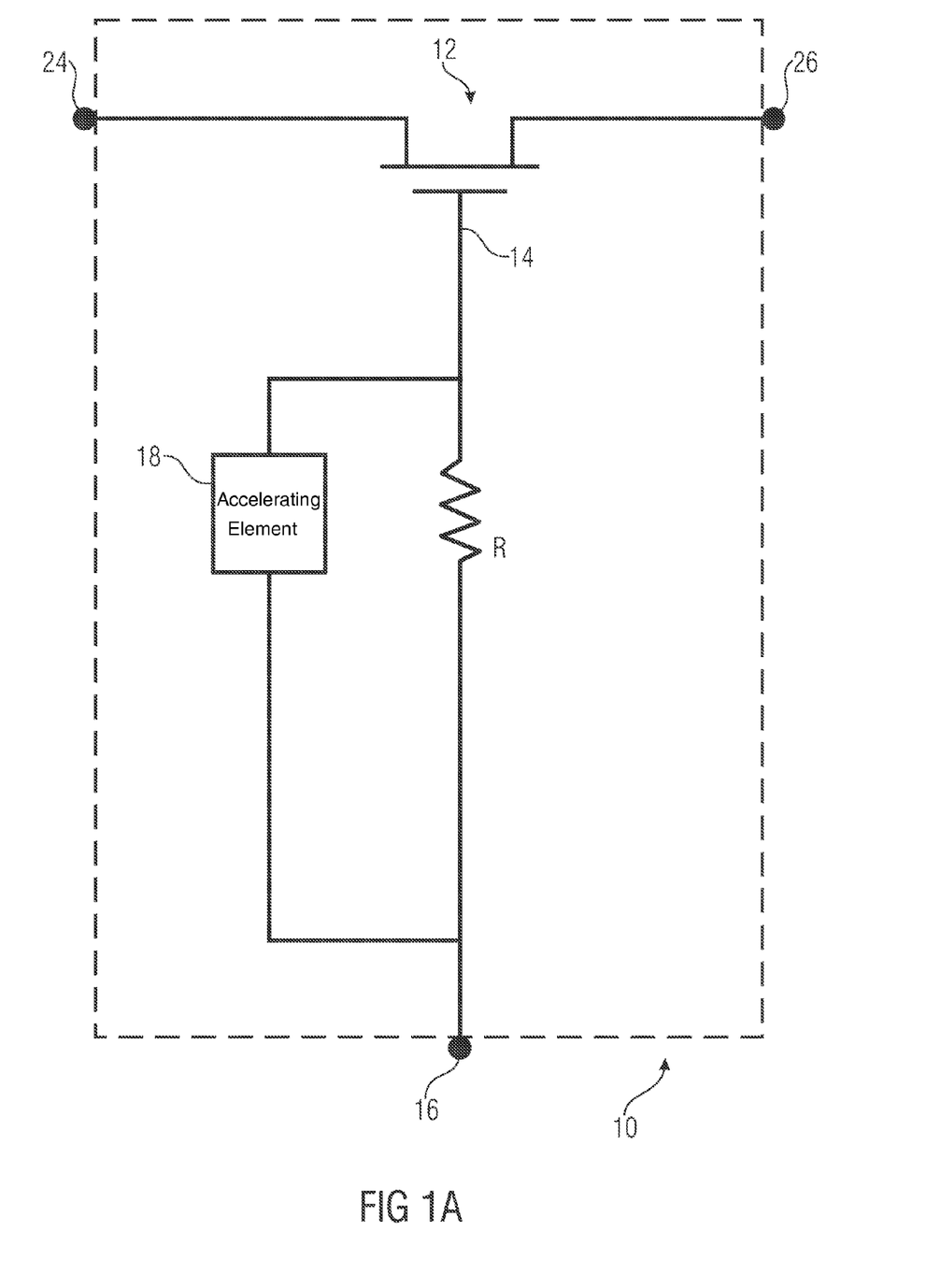
FIG. 1A shows a circuit diagram of a switch according to an embodiment of the invention.

FIG. 1A shows a circuit diagram of a switch according to an embodiment of the invention. The switch 10 comprises a switching transistor (FET) 12 and a switching resistor R connected between a control terminal 14 of the switching transistor 12 and a switching control terminal 16. The switch 10 further comprises an accelerating element 18 having a resistance smaller than a resistance of the switching resistor R. The accelerating element 18 may be switched in parallel to the switching resistor R upon switching of the switching transistor 12 until a voltage at the control terminal 14 of the switching transistor 12 has reached a predetermined value.

The capacitance at the control terminal is a parasitic capacitance depending on the semiconductor material, design, channel length and gate length. It may comprise the gate-source capacitance and the Miller capacitance of the FET 12. After charging the gate-source capacitance a channel in the FET 12 is formed. A charging of the Miller capacitance reduces the depletion region such that the FET 12 is switched-on. A reaction time of the FET 12 depends on a time constant formed by the parallel connection of the capacitance at the control terminal (gate-source capacitance and/or Miller capacitance) and a resistance at the control terminal. The resistance at the control terminal is formed by the parallel connection of R and the accelerating element 18 and is large when the accelerating element 18 has a high resistance and small when the accelerating element 18 has a small resistance. The time constant may be determined by a multiplication of the resistance at the control terminal and the capacitance at the control terminal.

The switch 10 is connected between an input terminal 24 and an output terminal 26. The switch 10 switches a signal received at the input terminal 24 to the output terminal 26 when in a conductive state and isolates the signal received at the input terminal 24 from the output terminal 26 when in a blocking state. The control terminal 14 of the switching transistor 12 receives a switching control signal at the switching control terminal 16 for switching the switching transistor 12 between a conductive state and a blocking state.

The switching resistor R is dimensioned to isolate a signal received at the input terminal 24 from the switching control terminal 16. The resistance of the switching resistor R and the capacitance of the control terminal 14 of the switching transistor 12 form an RC time constant of a low-pass circuit being responsible for the switching time. Due to technology limitations, the capacitance of the control terminal 14 of the switching transistor 12 shall not be varied. Therefore the switching resistor R defines the switching time. A small value for the switching resistor R results in a fast switching time, whereas a large value of the switching resistor R results in a slow switching time. Since the switching resistor R is used to isolate the signal received at the input terminal 24 from the switching control terminal 16 the switching resistor R should not fall below a predetermined value (dependent from the signal to be switched and received at the input terminal 24). For radio frequency signals, for example, typical values of the switching resistor R range from about 20 k$\Omega$ to about 300 k$\Omega$. According to embodiments of the invention the switching resistor may be about 30 kΩ. The channel widths of the switching transistors 12 in a typical RF switch are in the range of few millimeters determining a large gate-bulk capacitance in the on-state in the range of several pF to about 100 pF dependent on the transistor size. The combination of a large parasitic capacitance (corresponding to the capacitance at the control terminal 14 of the switching transistor 12) and the high switching resistor values and a limited driving voltage amplitude available at the switching control terminal 16 results in switching times as slow as a few microseconds. For example, a switching resistor R value of 30 kΩ) together with a control terminal 14 capacitance at the switching transistor 12 of 100 pF define an RC time constant of 3 μs. The switching resistor R has a high resistance, to prevent additional loss and distortion due to insufficient radio frequency isolation between the control terminal 14 of the switching transistor 12 and the switching control terminal 16 which is used for connecting low output impedance control terminal drivers.

The switch 10 according to embodiments of the invention reduces the switching time by switching an accelerating element 18 in parallel to the switching resistor R to reduce the resistance connected at the control terminal 14 of the switching transistor 12 during switching of the switching transistor 12. The accelerating element 18 comprises a resistance smaller than the resistance of the switching resistor R to reduce the RC time constant of the switching transistor 12 during switching of the switch 10. The switching of the accelerating element 18 in parallel to the switching resistor R reduces the voltage at the control terminal 14 of the switching transistor 12 dependent on the RC time constant.

The switching transistor 12 may be a MOSFET transistor comprising a gate capacitance corresponding to the control terminal 14 capacitance of the switching transistor 12. A discharging and recharging of the gate capacitance specifies the possible switching time of the switching transistor 12. The accelerating element 18 will accelerate a discharging or charging of the gate capacitance of the switching transistor 12 due to a reduced gate resistance during switching of the switching transistor 12.

When the switching transistor 12 changes from a blocking state to a conductive state, the accelerating element 18 is switched in parallel to the switching resistor R, such that the gate capacitance of the switching transistor 12 discharges. After the discharging process has finished the accelerating element 18 is switched off from the switching resistor R such that the control terminal 14 shows a high resistance specified by the switching resistor R to isolate a signal received at the input terminal 24 from the switching control terminal 16.

When the switching transistor 12 changes from the conductive state to the blocking state the accelerating element 18 is again switched in parallel to the switching resistor R to allow an accelerated charging of the gate capacitance of the switching transistor 12. After the switching transistor 12 has finished charging its gate capacitance the accelerating element 18 is switched off from the switching resistor R to provide a high resistance of the control terminal 14 of the switching transistor 12 to isolate the signal received at the input terminal 24 from the switching control terminal 16.

Figure 1B:
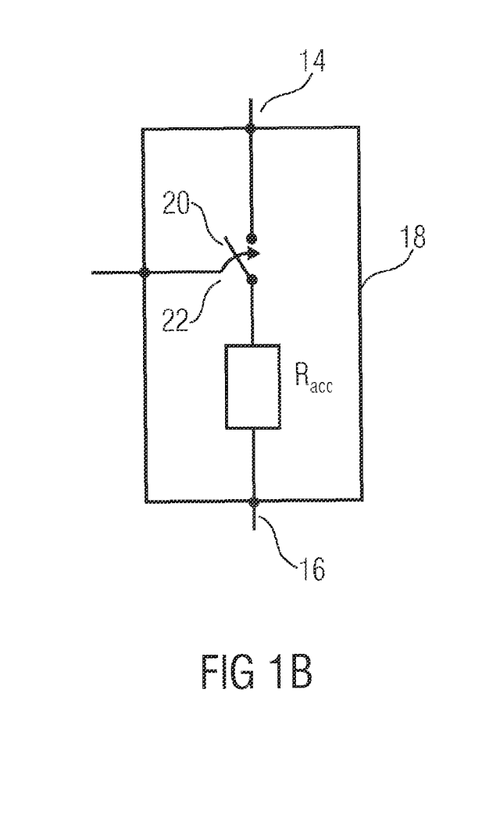
FIG. 1B shows a circuit diagram of an accelerating element according to an embodiment of the invention comprising a series connection of a resistor and a switch.
Figure 1C:
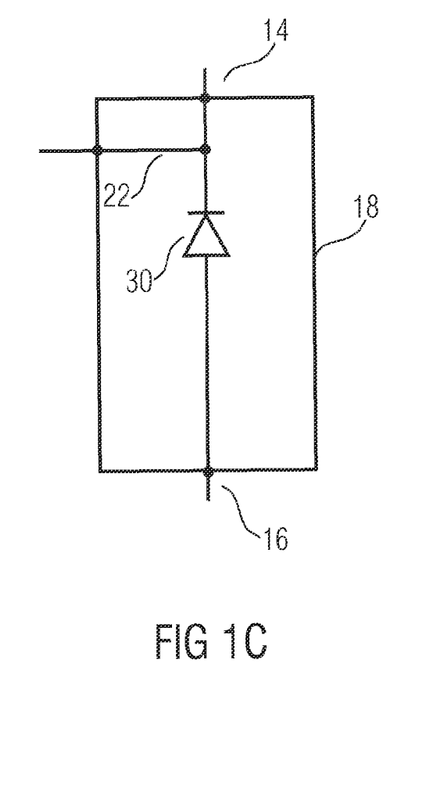
FIG. 1C shows a circuit diagram of an accelerating element according to another embodiment of the invention comprising a diode.
Figure 1D:
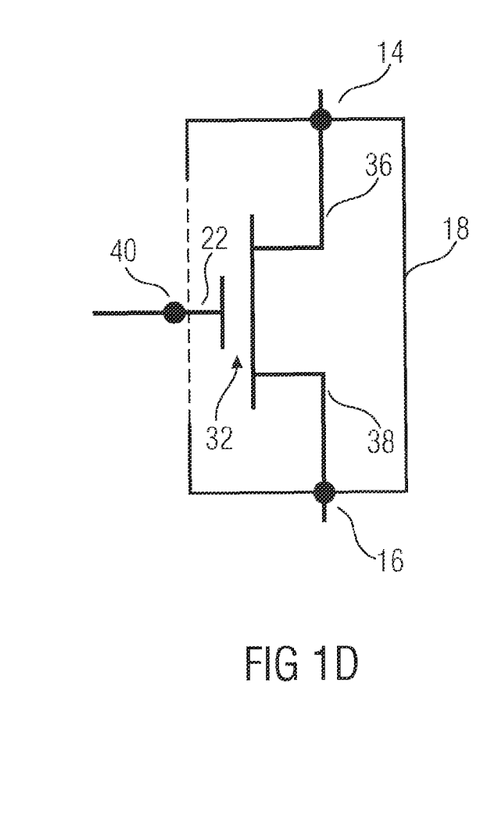
FIG. 1D shows a circuit diagram of an accelerating element according to another embodiment of the invention comprising a field effect transistor (FET)

The switching of the accelerating element 18 may be performed by the accelerating switch 20 which is controlled by the accelerating control signal 22 (see FIGS. 1B-1D). The accelerating control signal 22 is adapted to adjust switching of the accelerating element 18 in parallel to the switching resistor R to the discharging and charging processes of the gate capacitance of the switching transistor 12. The accelerating control signal 22 may depend on a switching signal received at the switching control terminal 16 which is adapted to switch the switching transistor 12 to switch the signal received at the input terminal 24 to the output terminal 26. The accelerating control signal 22 may further depend on an RC time constant corresponding to the RC time constant of the switching transistor 12. For example, an apparatus using a similar resistance as the resistance of the switching resistor R and a replica of the gate capacitance of the switching transistor 12, may generate the accelerating control signal 22 depending on the switching signal received at the switching control terminal 16.

As shown in FIG. 1B, the switch 10 according to this embodiment may comprise an accelerating element having an accelerating resistor $R_{acc}$ and a switch 20 for switching the resistor $R_{acc}$ in parallel to the switching resistor R. The switch 20 is controlled by an accelerating control signal 22. The accelerating element 18 is connected in parallel to the switching resistor R between the control terminal 14 of the switching transistor 12 and the switching control terminal 16.

As shown in FIG. 1C, the accelerating element 18 may also comprise a diode 30 with a forward direction resistance being smaller than the resistance of the switching resistor R. The diode may, for example, be connected in forward direction parallel to the switching resistor R upon recharging processes of the gate capacitance of the switching transistor 12 and may be switched by the accelerating control signal 22 in reverse direction parallel to the switching resistor R as soon as the charging/recharging process of the gate capacitance of the switching transistor 12 has finished.

The diode 30 may comprise a plurality of diodes and/or non-linear elements which may be switched by the accelerating control signal 22 from a first state having a first (e.g., high) impedance to a second state having a second (e.g., low) impedance. The accelerating element 18 is connected in parallel to the switching resistor R between the control terminal 14 of the switching transistor 12 and the switching control terminal 16.

The diode 30 may comprise two switchable diodes reversely connected in series, such that cathodes of the two switchable diodes are connected together. The two diodes may be switched by the accelerating control signal 22 being received by the connected cathodes. The diode 30 may also comprise a plurality of the two switchable diodes.

The accelerating element 18 may also comprise an accelerating transistor (FET) 32 controlled by the accelerating control signal 22, which is shown in FIG. 1D or an accelerating transistor stack (=a plurality of transistors connected in series). Switching of the accelerating element 18 from a first state indicating a high impedance corresponding to a high channel resistance of the FET 32 to a second state indicating a low impedance corresponding to a low channel resistance of the FET 32 is controlled by the accelerating control signal 22 received at a control terminal of the accelerating element 18.

In FIG. 1D the accelerating element 18 comprises a FET 32. The FET 32 comprises a first terminal 36 connected to the control terminal 14 of the switching transistor 12, a second terminal 38 connected to the switching control terminal 16 and a control terminal 40 used to receive the accelerating control signal 22.

The control terminal 40 receives the accelerating control signal 22. The accelerating control signal 22 has signal states for switching the FET 32 on or off. The FET 32 has a channel width smaller than the channel width of the switching FET 12, i.e., has a lower resistance. The width of the FET 32 is selected such that a resistance of the FET 32 connected in parallel to the resistor R is smaller than the resistance of the switching resistor R. The FET 32 is switched on during a time period described above following the transition of the switching signal at the switching control terminal 16.

Figure 2:
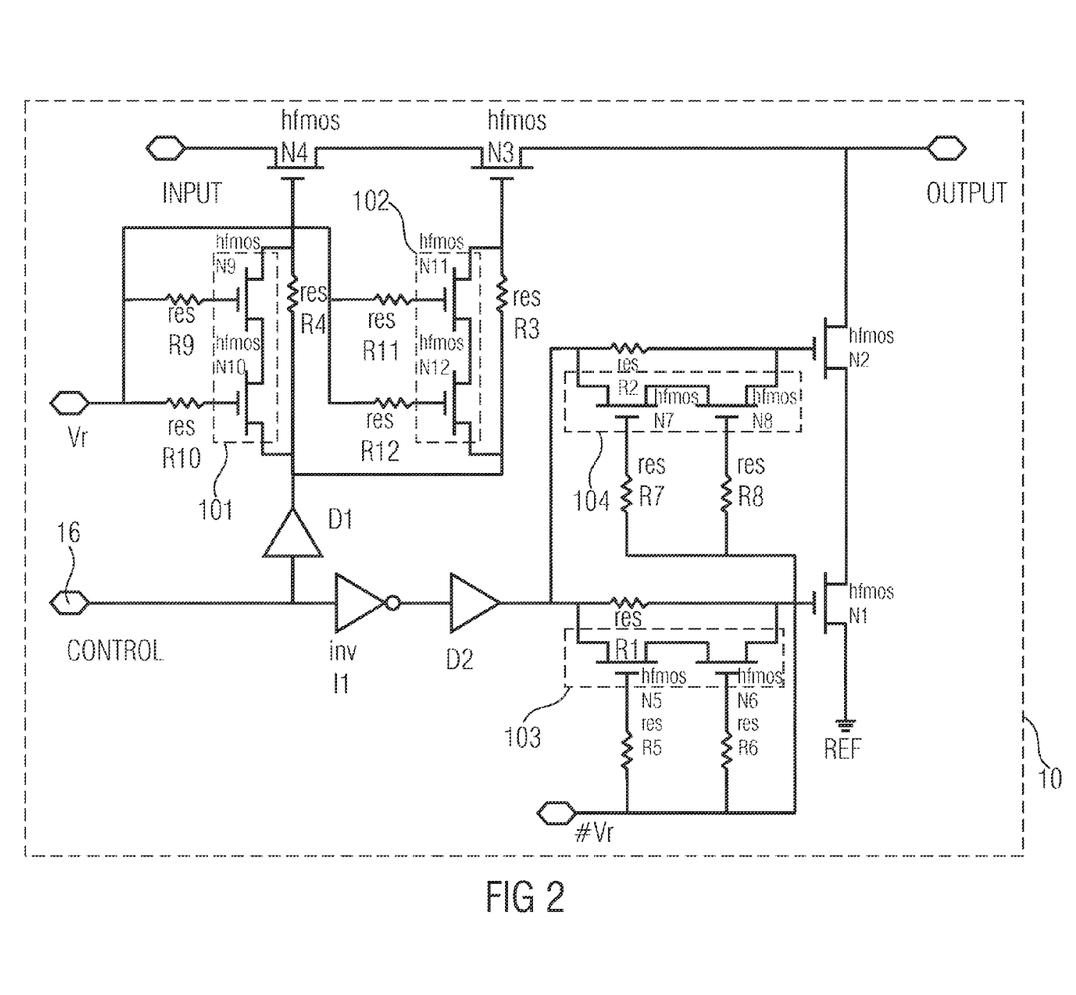
FIG. 2 shows a circuit diagram of a switch according to another embodiment of the invention.

FIG. 2 shows a circuit diagram of a switch according to another embodiment of the invention. The switch 10 comprises an input terminal INPUT for receiving an input signal and an output terminal OUTPUT, a reference terminal REF connected to a reference voltage, for example, ground, the switching control terminal CONTROL 16 for receiving the switching control signal, a first accelerating control terminal Vr for receiving a first accelerating control signal and a second accelerating control terminal #Vr for receiving a second accelerating control signal.

The switch 10 comprises four switching transistors N1-N4, four accelerating elements 101-104 and four switching resistors R1-R4. The switch 10 further comprises a first driver D1 connected to the switching control terminal CONTROL and a second driver D2 connected via an inverter I1 to the switching control terminal CONTROL.

The first switching resistor R4 is connected between the control terminal of the first switching transistor N4 and the output of the first driver D1. The second switching resistor R3 is connected between the control terminal of the second switching transistor N3 and the output of the first driver D1, wherein the input of the first driver D1 is connected to switching control terminal 16. The third switching resistor R1 is connected between the control terminal of the third switching transistor N1 and the output of the second driver D2. The fourth switching resistor R2 is connected between the control terminal of the fourth switching transistor N2 and the output of the second driver D2.

The accelerating elements 101-104 are connected in parallel to the respective switching resistors R4 to R1.

The first terminal of the first switching transistor N4 is connected to the second terminal of the second switching transistor N3. The second terminal of the first switching transistor N4 is connected to the input terminal INPUT. The first terminal of the second switching transistor N3 is connected to the output terminal OUTPUT. The second terminal of the second switching transistor N3 is connected to the first terminal of the first switching transistor N4. The first terminal of the third switching transistor N1 is connected to the reference terminal REF. The second terminal of the third switching transistor N1 is connected to the first terminal of the fourth switching transistor N2. The first terminal of the fourth switching transistor N2 is connected to the second terminal of the third switching transistor N1. The second terminal of the fourth switching transistor N2 is connected to the output terminal OUTPUT.

Each of the accelerating elements 101-104 comprises respective accelerating transistors N5-N12 connected in series.

The first terminal of the first accelerating transistor N10 is connected via the first driver D1 to the switching control terminal CONTROL. The second terminal of the first accelerating transistor N10 is connected to the first terminal of the second accelerating transistor N9. The control terminal of the first accelerating transistor N10 is connected via a first accelerating resistor R10 to the first accelerating control terminal Vr. The first terminal of the second accelerating transistor N9 is connected to the second terminal of the first accelerating transistor N10. The second terminal of the second accelerating transistor N9 is connected to the control terminal of the first switching transistor N4. The control terminal of the second accelerating transistor N9 is connected by a second accelerating resistor R9 to the accelerating control terminal Vr.

The first terminal of the third accelerating transistor N12 is connected via the first driver D1 to the switching control terminal CONTROL. The second terminal of the third accelerating transistor N12 is connected to the first terminal of the fourth accelerating transistor N11. The control terminal of the third accelerating transistor N12 is connected via a third accelerating resistor R12 to the first accelerating control terminal Vr. The first terminal of the fourth accelerating transistor N11 is connected to the second terminal of the third accelerating transistor N12. The second terminal of the fourth accelerating transistor N11 is connected to the control terminal of the second switching transistor N3. The control terminal of the fourth accelerating transistor N11 is connected by a fourth accelerating resistor R11 to the accelerating control terminal Vr.

The first terminal of the fifth accelerating transistor N5 is connected to the second terminal of the sixth accelerating transistor N6. The second terminal of the fifth accelerating transistor N5 is connected via the second driver D2 and the inverter I1 to the switching control terminal CONTROL. The control terminal of the fifth accelerating transistor N5 is connected via a fifth accelerating resistor R5 to the second accelerating control terminal #Vr. The first terminal of the sixth accelerating transistor N6 is connected to the control terminal of the third switching transistor N1. The second terminal of the sixth accelerating transistor N6 is connected to the first terminal of the fifth accelerating transistor N5. The control terminal of the sixth accelerating transistor N6 is connected by a sixth accelerating resistor R6 to the second accelerating control terminal #Vr.

The first terminal of the seventh accelerating transistor N7 is connected to the second terminal of the eighth accelerating transistor N8. The second terminal of the seventh accelerating transistor N7 is connected via the second driver D2 and the inverter I1 to the switching control terminal CONTROL. The control terminal of the seventh accelerating transistor N7 is connected via a seventh accelerating resistor R7 to the second accelerating control terminal #Vr. The first terminal of the eighth accelerating transistor N8 is connected to the control terminal of the fourth switching transistor N2. The second terminal of the eighth accelerating transistor N8 is connected to the first terminal of the seventh accelerating transistor N7. The control terminal of the eighth accelerating transistor N8 is connected by an eighth accelerating resistor R8 to the second accelerating control terminal #Vr.

The accelerating transistors N10, N9, N12, N11 of the accelerating elements 101 and 102 are controlled by an accelerating control signal received at the first accelerating control terminal Vr. The accelerating control signal switches on the transistors during a first predetermined time period following a transition of the switching control signal to accelerate a charging or discharging of gate capacitances of the first and second switching transistors N4 and N3. Likewise, the accelerating transistors N5, N6, N7, N8 of the accelerating elements 103 and 104 are controlled by a second accelerating control signal received at the second accelerating control terminal #Vr. The second accelerating control signal switches on the transistors during a second predetermined time period following a transition of the switching control signal to accelerate a charging or discharging of gate capacitances of the third and fourth switching transistors N1 and N2.

The first and second predetermined time periods depend on the RC time constant of the parallel connection of the resistance and the capacitance at the control terminal of the respective switching transistors and are controlled by the accelerating control signals which are generated on the transition of a switching control signal received at the switching control terminal CONTROL. The first and second predetermined time periods are described in the following FIGS. 3 and 4.

The switch 10 represents a single pole double throw (SP2T) switch which switches an input signal received at the input terminal INPUT, e.g., a radio frequency (RF) signal, to the output terminal OUTPUT or switches a reference signal received at the reference terminal REF, e.g., a ground, to the output terminal OUTPUT depending on the switching control signal received at the switching control terminal CONTROL. The transistors of the switch 100 may be field effect transistors, metal oxide semiconductor transistors or complementary metal oxide semiconductor transistors.

The switch 10 comprises an input-output path comprising the first switching transistor N4 and the second switching transistor N3, and a reference output path comprising the third switching transistor N1 and the fourth switching transistor N2. Both the first and second switching transistors N4, N3 and the third and fourth switching transistors N1, N2 are connected in a stacked conFIGuration. A stacked conFIGuration is a series connection of the switching transistors with respect to their first and second terminals such that a voltage across the stacked transistors may be divided in voltages across the single transistors. This results in higher blocking voltages for the stacked conFIGuration of transistors.

FIG. 2 shows a stacked conFIGuration of two transistors, however, any other number of transistors to be stacked can be used. Depending on the blocking voltage requirements between the input terminal INPUT and the output terminal OUTPUT also a higher number of transistors to be stacked may be used. For example, implementing a blocking voltage of about 25 volts requires a number of 10 transistors to be stacked, if each of the transistors provides an individual blocking voltage of about 2.5 volts. In the reference-output path the third switching transistor N1 and the fourth switching transistor N2 are also stacked depending on the blocking voltage between the output terminal OUTPUT and the reference terminal REF. It may also be possible to have a different number of transistors to be stacked in the reference-output path than in the input-output path, for example if the reference-output path requires a different blocking voltage than the input-output path. For a blocking voltage of about 12.5 volts in the reference output path, for example, a number of 5 transistors to be stacked is sufficient, if each of the transistors provides a blocking voltage of about 2.5 volts. Besides the switching transistors also the accelerating transistors may be arranged in a stacked conFIGuration. Each of the four accelerating elements 101, 102, 103, 104 may comprise an identical number of transistors to be stacked or a different number of transistors to be stacked depending on the blocking voltage required between the control terminals of the respective switching transistors and the output of the respective drivers. The switching resistors R4, R3, R1, R2 isolate voltages at the respective control terminals of the switching transistors N4, N3, N1, N2 from the output of the drivers D1, D2, which may have a low ohmic output.

The stacking of switching transistors 12 makes the stacked switching transistors 12 dissipate little radio frequency energy through the stacked switching resistors R. The RC time constant formed by the stacked switching resistor and the control terminal 14 capacitance of the stacked switching transistors 12 may be designed to be much longer than the period of the radio frequency received at the input terminal 24. By this arrangement a radio frequency voltage drop between the input terminal 24 and the output terminal 26 may be shared equally across the series-connected stacked switching transistors 12 such that the breakdown voltage across a series-connected stacked switching transistors is increased by the number of stacked switching transistors.

FIG. 2 depicts a switch 10 comprising conFIGurations of two stacked switching transistors and two stacked accelerating transistors. Another variant of the switch 10 as depicted in FIG. 2 comprises conFIGurations of 3 to 9 (or any number of) stacked switching transistors N1-N4 and 3 to 9 (or any same or other number of) stacked accelerating transistors N5-N12.

To summarize the above-mentioned, the switch 10 reduces the switching time in RF CMOS circuits down to several hundred nanoseconds without effecting the RF performance. The switch 10 improves significantly the switching time by shunting the accelerating elements 101, 102, 103, 104 to the resistors R4, R3, R1, R2. The accelerating elements 101, 102, 103, 104 may have stacked structures and are driven by a dedicated control circuitry (see FIGS. 5 and 6), which dedicated control circuitry provides the accelerating control signal received at the accelerating control terminal Vr, and the second accelerating control signal received at the second accelerating control terminal #Vr.

By this shunting structure formed of the accelerating elements 101, 102, 103, 104 parallel-connected to the switching (gate) resistors R4, R3, R1, R2 the RC time constants of the RF switching transistors N4, N3, N1, N2 are reduced during switching and thus, the switching time is significantly reduced.

The switch 10 allows improving the switching time in RF CMOS switches. Due to the limitations in the threshold and breakdown voltages of the CMOS transistors, for example, the switching transistors N4, N3, N1, N2, typically stacked structures are used to commutate large RF signals, for example, radio frequency signals received at the input terminal INPUT of the switch 10. The power handling capability depends on the control voltage $V_c$, the threshold voltage $V_{th}$, the system impedance $Z_o$ and the number of stacked transistors n and may be expressed by the equation:

$$P_{max} = \frac{n \cdot (V_c + V_{th})^2}{Zo}. \tag{1}$$

For a number of n=2 stacked transistors as depicted in FIG. 2 the equation may be expressed as:

$$P_{max} = \frac{2(V_c + V_{th})^2}{Zo}. \tag{2}$$

For numbers of 1 to 6 stacked transistors equation (1) can be expressed by replacing n by the number of stacked transistors. For a higher number of stacked transistors than n=6 parasitic capacitances to the substrate should be considered.

The drivers D1 and D2, as depicted in FIG. 2, provide the conversion of the switching control signal (voltage) received at the switching control terminal CONTROL to gate signals of the switching transistors (FETs) N4, N3, N1, N2 having appropriate signal levels, which are required to control the FETs. A positive switching control signal (voltage) switches N3 and N4 on and switches (due to the inverter I1) N1 and N2 off. A negative switching control signal (voltage) switches N3 and N4 off and switches N1 and N2 on. A switching on corresponds to a conductive state of the respective transistor while a switching off corresponds to a blocking state. The switching transistors N1-N4 are implemented as n-channel FETs, but can also be implemented as p-channel FETs. A DC voltage is applied to the FET gates through high ohmic resistors. During switching the DC voltage drop over the resistors is reduced by shunting by a transistor in parallel to the switching resistors of the FETs. The shunting reduces the RC time constant during switching and by this sharpens the voltage slope at the gates.

Typically the (switching) control voltage received at the switching control terminal CONTROL is chosen close to the breakdown limits in order to minimize the number of stacked transistors and respectively the integrated circuit (IC) area. The gate resistors R1 to R4 have high values to prevent additional loss and distortion due to insufficient radio frequency (RF) isolation between the gates of the switching transistors (N4, N3, N1, N2) and the low output impedance gate drivers (D1, D2). The transistor widths in a typical RF switch are in the range of a few millimeters determining a large gate bulk capacitance in on state in the range of several tens of picofarads. The combination of a large parasitic capacitance and the high gate resistor values (for example in the range of tens of Kilo Ohms) and the limited driving voltage amplitude (of the drivers D1, D2) results in switching times as long as a few microseconds. The switch 10 reduces the switching time and employs similar but much smaller accelerating elements 101, 102, 103, 104 in parallel to the gate resistors R4, R3, R1, R2 when compared to the stacked transistors switching structures (N4, N3, N1, N2) used to switch the RF signal in order to avoid additional distortion of the signal in the main path. The accelerating element 101, 102, 103, 104 can be implemented as a multi gate NMOS transistor as well. An example with two switching transistors (N4, N3 or N1, N2, respectively) is shown in FIG. 2. In high linearity switches a larger number of stacked transistors in the main path and parallel to the gate resistors can be used to insure linear operation low.

Since the width (channel width) and the gate bulk capacitances of the accelerating transistors (N5-N12) are relatively small compared to the channel widths of the switching transistors (N1-N4) a switching of the accelerating transistors (N5-N12) is faster than a switching of the switching transistors (N1-N4). The accelerating transistors (N5-N12) are switched on synchronous with the raising and falling edge of the main control signal (the switching control signal received at the switching control terminal CONTROL) for a short time period until the gates of the main transistors (the switching transistors N1-N4) are recharged. In case of switching the transistors (N1-N4) in the main path on (the gate voltage may be changed from negative to positive) during the raising edge of the (switching) control signal, for example, the voltage at the accelerating transistor gates should raise as well and be kept high together with the main path signal being high (which is depicted by time slice2 in FIG. 3). As soon as the gate capacitance at the main path charges up to $V_r - V_{th}$ ($V_{th}$ being the threshold voltage of the accelerating transistors N5-N12) the accelerating transistors N5-N12 switch off. When switching the main path off the (switching) control voltage of the accelerating transistors N5-N12 should be kept high enough time after the falling edge of the (primary) switching control signal, so that the accelerating transistors N5-N12 may switch on at the falling edge of the (primary) switching control signal and switch off when the gate capacitance of the main path recharges to $-V_r + V_{th}$. During the time slice 3 as depicted in FIG. 3, the accelerating transistors N5-N12 are switched on.

Figure 3:
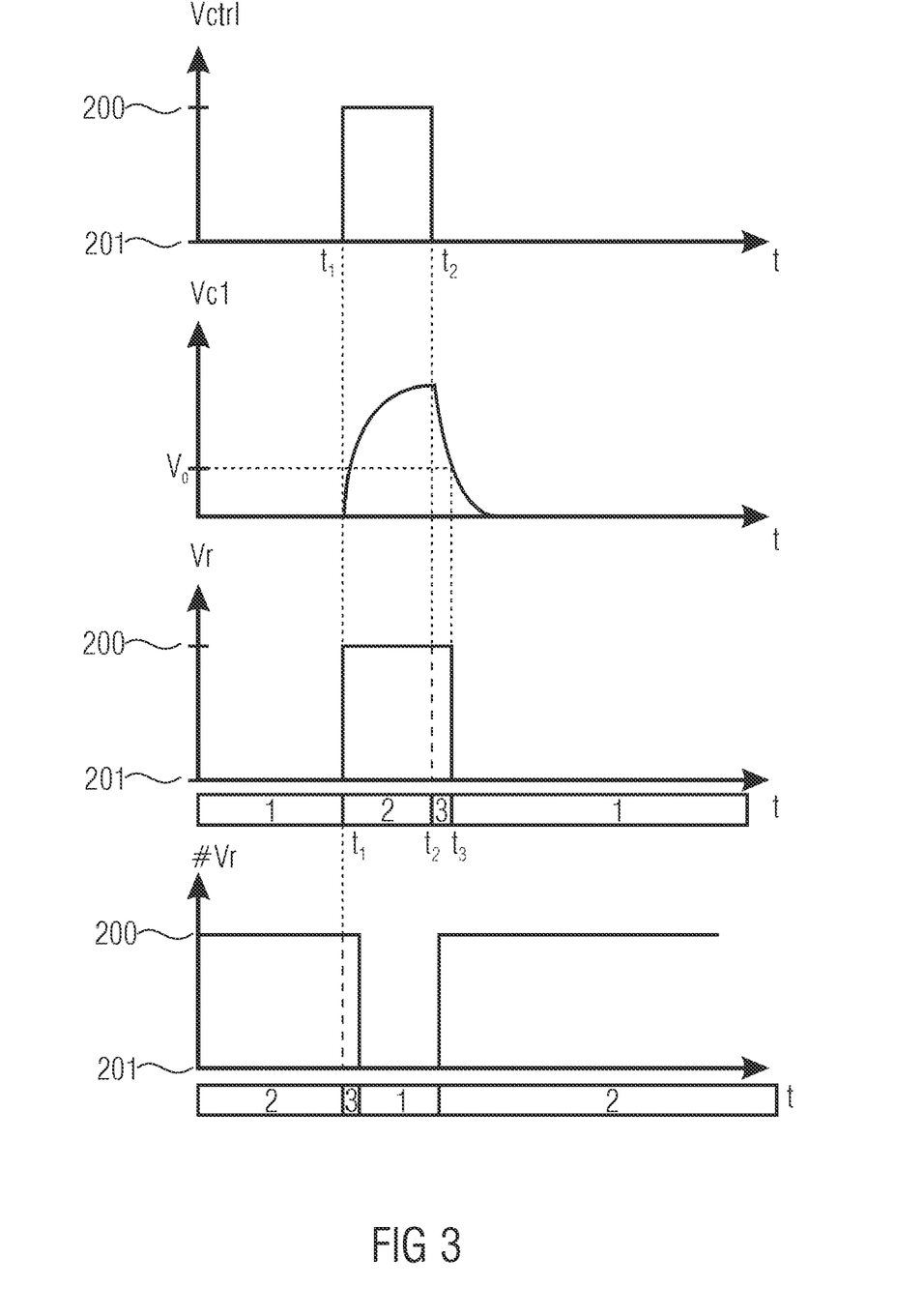
FIG. 3 shows a timing diagram of control signals for controlling a switch according to an embodiment of the invention.

FIG. 3 shows a timing diagram of control signals for controlling a switch according to an embodiment of the invention. The FIGure shows timing diagrams of four control signals, a switching control signal Vctrl, a low-pass filter output signal $V_{c1}$, an accelerating control signal Vr and a second accelerating control signal #Vr. A first timing diagram shows the switching control signal Vctrl which may be received at the switching control terminal CONTROL as depicted in FIG. 2 or which may be received at the switching control terminal 16 as depicted in FIGS. 1a, 1b, 1c, 1d. A second timing diagram shows a low-pass filter output signal $V_{c1}$ corresponding to a low-pass filtered version of the switching control signal Vctrl as depicted in the first timing diagram. A third timing diagram shows the accelerating control signal Vr which may be received at the accelerating control terminal Vr as depicted in FIG. 2 or at the control terminal 40 of the accelerating transistor 32 as depicted in FIG. 1d or which may be the accelerating control signal 22 of the accelerating switch 20 as depicted in FIG. 1b. A fourth timing diagram shows the second accelerating control signal #Vr which may be received at the second accelerating control terminal #Vr as depicted in FIG. 2 or at the control terminal 40 of the accelerating transistor 32 as depicted in FIG. 1d or which may correspond to the accelerating control signal 22 of the accelerating switch 20 as depicted in FIG. 1b.

The switching control signal Vctrl is in a first state 200 between a time $t_1$ and a time $t_2$ and in a second state 201 before the time $t_1$ and after the time $t_2$. The first state 200 may effect a conductive state of the switching transistors N4, N3 and a blocking state of the switching transistors N1, N2 as depicted in FIG. 2. Correspondingly the first state 200 may effect a conductive state of the switching transistor 12 as depicted in FIG. 1a. The second state 201 may effect a blocking state of the switching transistors N4, N3 and a conductive state of the switching transistors N1, N2 as depicted in FIG. 2 or correspondingly a blocking state of the switching transistor 12 as depicted in FIG. 1a. The low-pass filter output signal $V_{c1}$ is a low-pass filtered version of the switching control signal Vctrl having a rising edge when the switching control signal Vctrl changes to the first state and a falling edge when the switching control signal Vctrl changes to the second state. The rising and falling edges depend on the time constant of the low-pass-filter, which is used to low-pass filter the switching control signal Vctrl.

The accelerating control signal Vr is in the first state 200 between the times $t_1$ and $t_2$ and additionally between $t_2$ and $t_3$. The third time $t_3$ may be derived from the low-pass filter output signal $V_{c1}$. $t_3$ is the time at which a falling edge of the low-pass filter output signal $V_{c1}$ crosses a threshold $V_0$ as depicted in the second timing diagram. The threshold $V_0$ may be a threshold value of a Schmitt trigger circuit, for example. The accelerating control signal Vr is in the second state 201 at times before $t_1$ and after $t_3$. A first time slice 1 corresponds to times of the accelerating control signal Vr being in the second state 201 and the time slices 2 and 3 correspond to times at which the accelerating control signal Vr is in the first state 200. The time slice 2 corresponds to times at which the accelerating control signal Vr is in the same state as the switching control signal Vctrl. The time slice 3 corresponds to times at which the accelerating control signal Vr is in a different state than the switching control signal Vctrl.

The fourth timing diagram depicts the timing of the second accelerating control signal #Vr which is in a first state 200 at times smaller than $t_1$ and at times greater than $t_2$. The second accelerating control signal #Vr is additionally in the first state 200 between the times $t_1$ and $t_1 + t_3$ corresponding to a third time slice 3 associated with the second accelerating control signal #Vr. This time slice 3 is different from the time slice 3 associated with the accelerating control signal Vr as depicted in the third timing diagram. A second time slice 2 associated with the second accelerating control signal #Vr designates times at which the second accelerating control signal #Vr is in the same state as the inverted switching control signal Vctrl. A first time slice 1 associated with the second accelerating control signal #Vr designates times at which the second accelerating control signal #Vr is in the same state as the inverted switching control signal Vctrl. The first time slice 1 differs from the second time slice 2 in different states of the second accelerating control signal #Vr. The third time slice 3 associated with the second accelerating control signal #Vr designates times at which the second accelerating control signal #Vr corresponds to the switching control signal Vctrl, such that the state is equal to the first state 200. The third time slice 3 associated with the accelerating control signal Vr is different from the third time slice 3 associated with the second accelerating control signal #Vr and depends on the switching control signal Vctrl. The third time slices 3 of both accelerating control signals Vr, #Vr represent times at which capacitances of the switching transistors are charged or discharged depending on the switching control signal Vctrl.

For a single pole double throw (SP2T) switch as depicted in FIG. 2, both accelerating control signals are used to control the charging and discharging of the switching transistors, whereas for a single pole single throw (SPST) switch as depicted in FIGS. 1*a*, 1*b*, 1*c*, 1*d* one of the accelerating control signals, for example, the accelerating control signal Vr is used for controlling the charging and discharging of the switching transistor 12.

Figure 4:
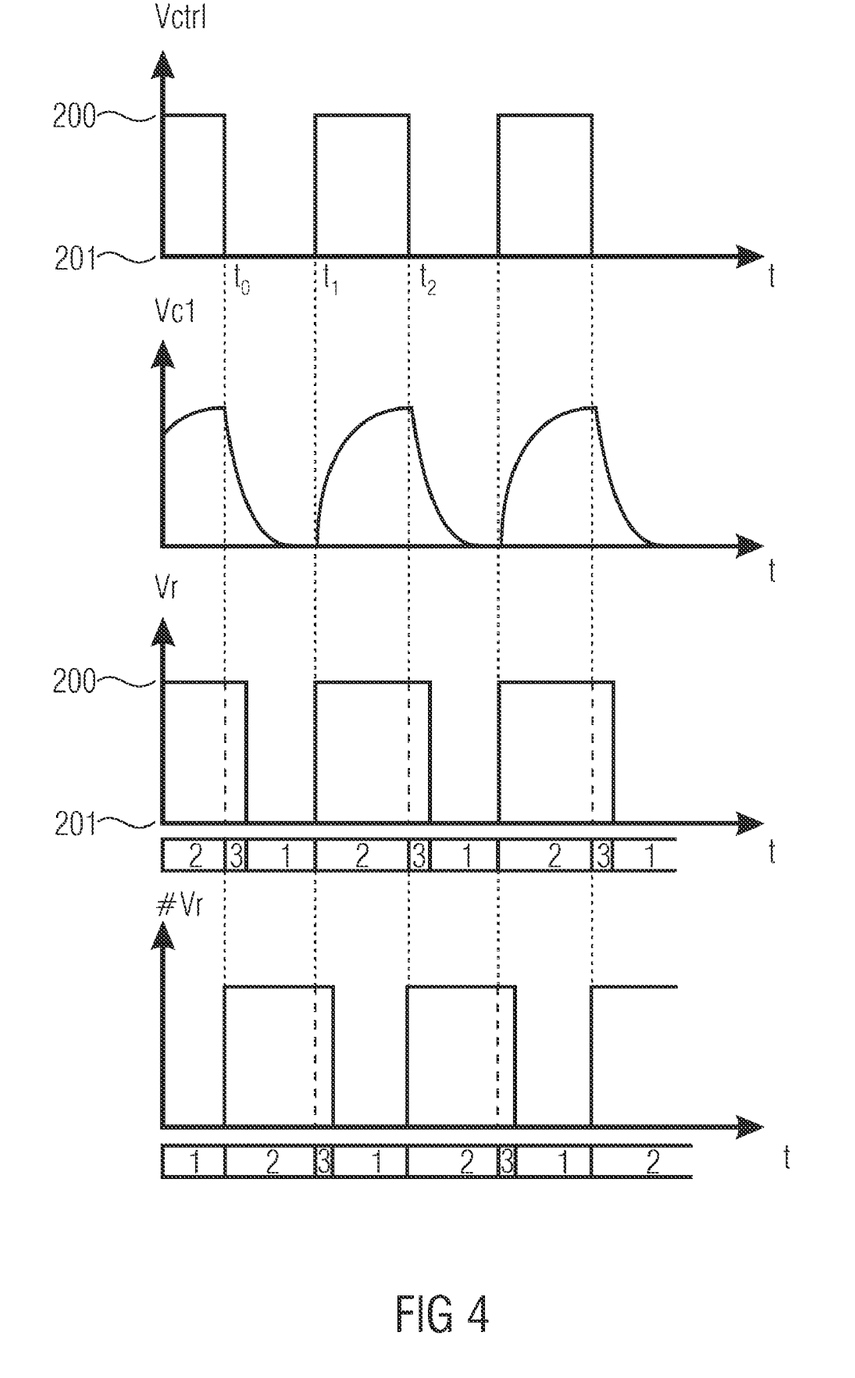
FIG. 4 shows a timing diagram of other control signals for controlling a switch according to an embodiment of the invention.

FIG. 4 shows another timing diagram of control signals for controlling a switch according to an embodiment of the invention. The FIGure corresponds to FIG. 3 in the number of timing diagrams and the designation of the timing diagrams. A first timing diagram designates the switching control signal Vctrl, a second timing diagram designates the low-pass filter output signal $V_{c1}$, a third timing diagram designates the accelerating control signal Vr and a fourth timing diagram designates the second accelerating control signal #Vr. In contrast to FIG. 3 the switching control signal Vctrl is a periodic signal being in the first state 200 periodically within a first period ($t_1$, $t_2$) of the switching control signal and being in the second state 201 periodically within a second signal period ($t_0$, $t_1$) of the switching control signal Vctrl. The low-pass filter output signal $V_{c1}$ is a periodic signal corresponding to a low-pass filtered version of the switching control signal Vctrl. The accelerating control signal Vr is in the first state at time slices 2, in the second state 201 at time slices 1 and additionally in the first state 200 at time slices 3, wherein at time slices 2 the accelerating control signal Vr being in the first state 200 corresponds to the switching control signal Vctrl, while at time slices 3 the accelerating control signal Vr is in the first state 200 and the switching control signal Vctrl is in the second state 201. The time slices 3 at which the accelerating control signal Vr is in the first state 200 correspond to the charging and discharging times of the switching transistors at which the accelerating elements 101, 102, 103, 104 as depicted in FIG. 2 are connected in parallel to the switching resistors R4, R3, R1, R2 to accelerate the charging or discharging process of the switching transistors.

A fourth timing diagram shows the timing of the second switching control signal #Vr. The time slices 3 associated with the second switching control signal #Vr are not corresponding to the time slices 3 associated with the accelerating control signal Vr. The accelerating control signal Vr controls a switching of a respective accelerating element in parallel to a respective switching resistor. The parallel-connection is held for a time period corresponding to time slice 3, as depicted in the third timing diagram after a switching of the switching control signal Vctrl from the first state 200 to the second state 201. The second accelerating control signal #Vr controls a switching of a respective accelerating element in parallel to a respective switching resistor. The parallel connection is held for a time period corresponding to time slice 3 as depicted in the fourth timing diagram after a switching of the switching control signal Vctrl from the second state 201 to the first state 200. By the two accelerating control signals Vr, #Vr a synchronous charging and discharging of gate capacitances of switching transistors associated with the switching control signal Vr and of switching transistors associated with the second accelerating control signal #Vr is achieved.

Figure 5:
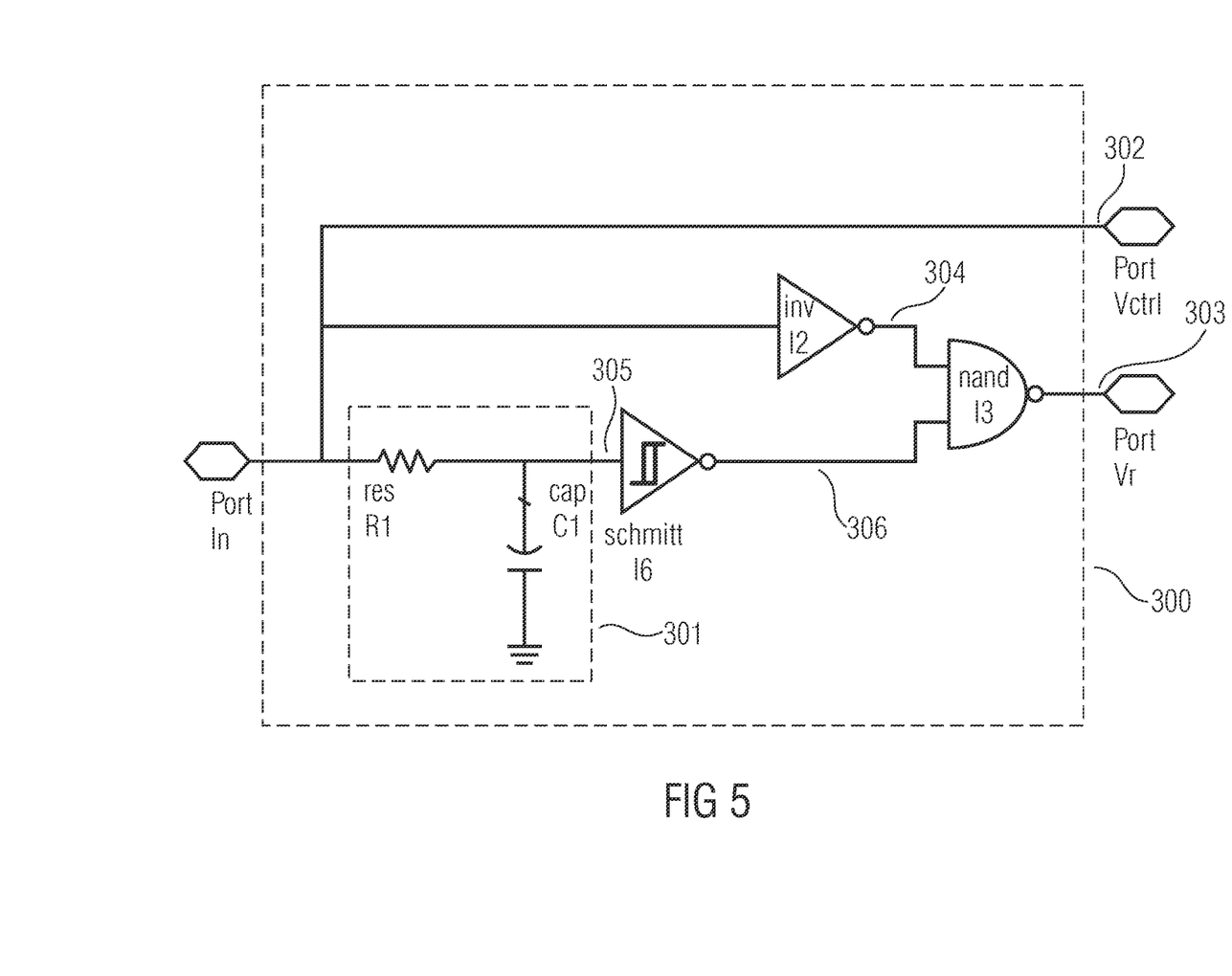
FIG. 5 shows a circuit diagram of an apparatus for controlling a switch according to an embodiment of the invention.

FIG. 5 shows a circuit diagram of an apparatus for controlling a switch according to an embodiment of the invention. The apparatus 300 comprises a switching control terminal Vctrl to receive a switching control signal 302 and comprises an accelerating control terminal Vr to provide an accelerating control signal 303. The apparatus 300 further comprises a low-pass filter 301, an inverter 12, a Schmitt trigger 16 and a NAND gate 13. The inverter 12 inverts the switching control signal 302 to provide an inverter output signal 304. The low-pass filter 301 comprises a resistor R1 connected between a low-pass filter input and a low-pass filter output and a capacitor C1 connected between the low-pass filter output and a reference (ground) node. The low-pass filter input receives the switching control signal 302 and the low-pass filter output provides a low-pass filter output signal 305. The low-pass filter 301 low-pass filters the switching control signal 302 to provide the low-pass filter output signal 305.

The Schmitt trigger 16 converts the low-pass filter output signal 305 to a Schmitt trigger output signal 306. The Schmitt trigger 16 is an inverted Schmitt trigger. The Schmitt trigger provides the Schmitt trigger output signal 306 being in a first state when the low-pass filter output signal 305 exceeds an upper threshold until the low-pass filter output signal 305 falls below a lower threshold and being in a second state when the low-pass filter output signal 305 falls below the lower threshold until the low-pass filter output signal 305 exceeds the upper threshold.

The NAND gate 13 combines the inverter output signal 304 and the Schmitt trigger output signal 306 by a logical NAND combination to provide the accelerating control signal 303. The apparatus 300 may comprise a further input terminal In which is connected to the switching control terminal Vctrl.

The switching control signal 302 may correspond to the switching control signal Vctrl as depicted in FIGS. 3 and 4. The accelerating control signal 303 may correspond to the accelerating control signal Vr or to the second accelerating control signal #Vr as depicted in FIGS. 3 and 4.

The apparatus 300 may be used to receive a switching control signal of a switch as depicted in FIGS. 1*a*, 1*b*, 1*c*, 1*d* and to provide an accelerating control signal for a switch as depicted in same FIGures. The apparatus 300 and the switch 10 may be integrated in a same electronic circuit, e.g., a same semiconductor device and may be manufactured in same semiconductor processing steps. The apparatus 300 may, for example, be implemented on a controller of an electronic circuit or a microprocessor for providing the control signals (Vr, #Vr) for the switch 10.

Figure 6:
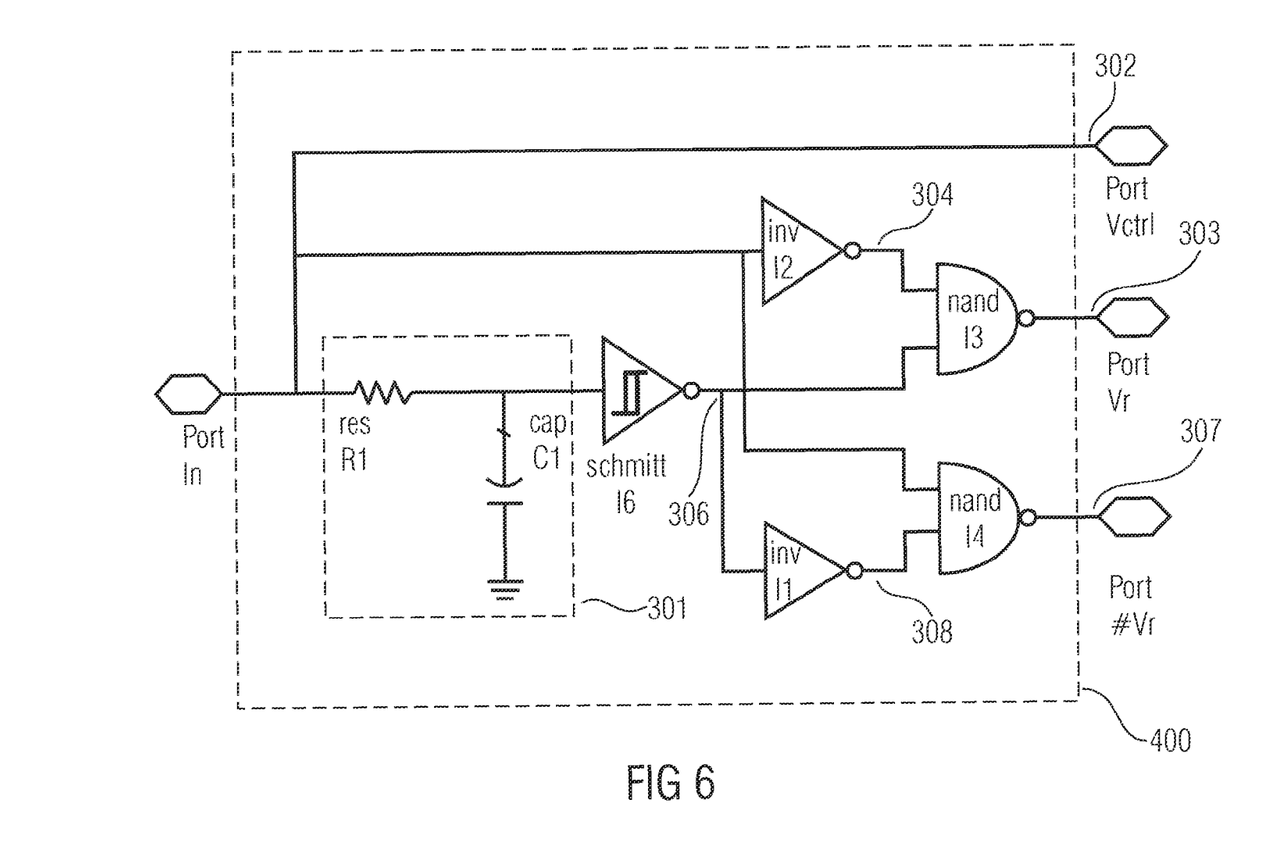
FIG. 6 shows a circuit diagram of another apparatus for controlling a switch according to an embodiment of the invention.

FIG. 6 shows a circuit diagram of an apparatus for controlling a switch according to another embodiment of the invention. The apparatus 400 comprises equivalent components as the apparatus 300 as depicted in FIG. 5 with respect to receiving the switching control signal 302 and for providing the accelerating control signal 303. The low-pass filter 301 corresponds to the low-pass filter 301 as depicted in FIG. 5, the Schmitt trigger 16 corresponds to the Schmitt trigger 16 as depicted in FIG. 5, the inverter 12 corresponds to the inverter 12 as depicted in FIG. 5 and the NAND gate 13 corresponds to the NAND gate 13 as depicted in FIG. 5.

The apparatus 400 further comprises a second inverter I1 and a second NAND gate 14. The apparatus 400 further comprises a second accelerating control terminal #Vr to provide a second accelerating control signal 307. The second inverter I1 inverts the Schmitt trigger output signal 306 to provide a second inverter output signal 308. The second NAND gate 14 combines the switching control signal 302 and the second inverter output signal 308 by a logical NAND combination to provide the second accelerating control signal 307.

The apparatus 400 may be applied for providing the accelerating control signal 303 and the second accelerating control signal 307 for the switch 100 as depicted in FIG. 2. The apparatus 400 and the switch 10 may be integrated in a same electronic device.

A method for switching a switching transistor comprising a switching resistor connected to a control terminal of the switching transistor comprises the step "switching an accelerating element, comprising a resistance smaller than a resistance of the switching resistor, in parallel to the switching resistor upon switching of the switching transistor until a voltage of the control terminal of the switching transistor has reached a predetermined value".

The switch 10 as depicted in FIG. 2 may alternatively or additionally comprise accelerating elements 101, 102, 103, 104 corresponding to the accelerating elements 18 as depicted in FIGS. 1a, 1b, 1c, 1d. The accelerating elements 18 may be arranged in stacked structures, i.e., series-connections of respective accelerating elements 18. A stacked structure may also comprise series connections of an accelerating elements 18 as depicted in FIG. 1a, FIG. 1b, FIG. 1c and/or FIG. 1d. The switching transistors N1-N4 may be arranged in stacked structures. The number of elements of a stacked structure of switching transistors N1-N4 may vary from the number of elements of a stacked structure of accelerating elements 101, 102, 103, 104.

The switching transistors N1-N4 and accelerating transistors N5-N12 may be implemented as MOSFET transistors. Other embodiments of the invention comprise MESFETs (metal epitaxial semiconductor field effect transistors), HEMTs (high electron mobility transistors) or pHEMTs (pseudomorphic high electron mobility transistors) for realizing the switching transistors N1-N4 and accelerating transistors N5-N12. Another embodiment utilizes JFETs (junction field effect transistors) as accelerating transistors N5-N12. Any kind of switching transistors N1-N4 mentioned above can be combined with any kind of accelerating transistors N5-N12 mentioned above.

Using bipolar switching N1-N4 and accelerating transistors N5-N12 is also a possible variant for implementing the switch. However, the switch implemented with the transistor types as mentioned above provides an improved linearity compared to an implementation with bipolar transistors.

The switch 10 may comprise further input terminals for implementing Single Pole Multi Throw switches. The apparatus 300 and 400 are embodiments for providing the signals as depicted in FIGS. 3 and 4. They may comprise other logic functional blocks for implementing the signals as depicted in FIGS. 3 and 4.

The features described in the following claims are interchangeable. A combination of features in dependent claims does not exclude other features described in other claims.

What is claimed is:

1. A switch, comprising:
a switching transistor;
a switching resistor connected between a control terminal of the switching transistor and a switching control terminal, wherein a switching signal is received at the switching control terminal;
an accelerating element comprising a resistance smaller than a resistance of the switching resistor, the accelerating element being adapted to be connected in parallel to the switching resistor under the control of an accelerating control signal upon switching of the switching transistor until a voltage at the control terminal of the switching transistor has reached a predetermined value; and
an apparatus configured to generate the accelerating control signal depending on the switching signal received at the switching control terminal, such that the accelerating control signal switches on the accelerating element during a predetermined time period following a transition of the switching signal.

2. The switch as claimed in claim 1, wherein the switching transistor is adapted to be switched by the switching signal at the switching control terminal, and the accelerating control signal is provided to connect the accelerating element in parallel to the switching resistor for a predetermined period of time following a switching control signal transition between two states of the switching control signal.

3. The switch as claimed in claim 2, wherein the predetermined period of time depends on an RC time constant of a circuit comprising the switching transistor, the switching resistor and the accelerating element.

4. The switch as claimed in claim 2, wherein the switching control signal comprises a first signal state effecting a conductive state of the switching transistor and a second signal state effecting a blocking state of the switching transistor;
the accelerating control signal comprises a first signal state connecting the accelerating element in parallel to the switching resistor during the predetermined period of time following a transition of the switching control signal between the first and second states.

5. The switch as claimed in claim 4, wherein the accelerating control signal is adapted to change to a second signal state disconnecting the accelerating element from the switching resistor responsive to an expiration of the predetermined period of time.

6. The switch as claimed in claim 1, further comprising an accelerating switch controlled by the accelerating control signal and being adapted to switch the accelerating element in parallel to the switching resistor.

7. The switch as claimed in claim 6, wherein the accelerating element comprises an accelerating resistor connected between the control terminal of the switching transistor and the switching control terminal.

8. The switch as claimed in claim 1, wherein the accelerating element comprises a diode connected between the control terminal of the switching transistor and the switching control terminal, the diode being adapted to be controlled by the accelerating control signal.

9. The switch as claimed in claim 1, wherein the accelerating element comprises an accelerating transistor comprising a first terminal connected to the control terminal of the switching transistor, a second terminal connected to the switching control terminal and a control terminal, the control terminal being adapted to receive the accelerating control signal.

10. The switch as claimed in claim 9, wherein the accelerating transistor comprises a channel width smaller than a channel width of the switching transistor.

11. The switch as claimed in claim 1, wherein the accelerating element comprises a plurality of accelerating transistors connected in series between the control terminal of the switching transistor and the switching control terminal, control terminals of the plurality of accelerating transistors being adapted to receive the accelerating control signal.

12. The switch as claimed in claim 11, comprising;
a plurality of switching transistors connected in series; and
a plurality of switching resistors, each of the switching resistors being associated with one of the plurality of switching transistors;
wherein each of the plurality of accelerating transistors is associated with one of the switching resistors.

13. The switch as claimed in claim 9, wherein the switching transistor and the accelerating transistor comprise CMOS FETs or wherein the accelerating transistor comprises a JFET.

14. A switch, comprising:
an input terminal;
an output terminal;
a switching control terminal;
a first switching transistor connected between the input terminal and the output terminal;
a first switching resistor connected between a control terminal of the first switching transistor and the switching control terminal;
a first accelerating element comprising a resistance smaller than a resistance of the first switching resistor;
a second switching transistor connected between a reference terminal and the output terminal;
a second switching resistor connected between a control terminal of the second switching transistor and the switching control terminal; and
a second accelerating element comprising a resistance smaller than a resistance of the second switching resistor,
the first and second accelerating elements being adapted to be connected in parallel to the first and second switching resistors, respectively, upon switching of the first and second switching transistors until capacitances at the control terminal of the first and second switching transistors have reached respective predetermined capacitances.

15. The switch as claimed in claim 14, wherein each of the first switching transistor, the second switching transistor, the first accelerating element and the second accelerating element comprises a plurality of FETs connected in series;
wherein a channel width of the FETs of the first and second accelerating elements is smaller than a channel width of the FETs of the first and second switching transistors, and
wherein the first and second accelerating elements are connected in parallel to the respective switching resistors responsive to a first accelerating control signal and a second accelerating control signal;
wherein the first and second accelerating control signals change to a first state responsive to a transition of a switching control signal at the switching control terminal between a first state and a second state, the first state of the first and second accelerating control signals causing a parallel connection of the accelerating element to the respective switching transistors; and
wherein the first and second accelerating control signals remain in the first state during first and second predetermined periods of time following the transition of the respective switching control signals, the time periods being determined by an RC constant of a circuit comprising the respective switching transistors, the respective switching resistors and the respective accelerating elements.

16. The switch of claim 14, comprising a controller adapted to receive a switching control signal and to provide an accelerating control signal, the controller comprising:
an inverter adapted to invert the switching control signal to provide an inverter output signal;
an RC low-pass filter adapted to low-pass filter the switching control signal to provide a low-pass filter output signal;
a Schmitt-trigger-circuit adapted to convert the low-pass filter output signal to a Schmitt-trigger-circuit output signal; and
a NAND gate adapted to combine the inverter output signal and the Schmitt-trigger-circuit output signal by a logical NAND combination to provide the accelerating control signal.

17. The switch as claimed in claim 16, wherein the controller comprises:
a second inverter adapted to invert the Schmitt trigger circuit output signal to provide a second inverter output signal; and
a second NAND gate adapted to combine the switching control signal and the second inverter output signal by a logical NAND combination to provide a second accelerating control signal.

18. A method for switching a switching transistor comprising a switching resistor connected between a control terminal of the switching transistor and a switching control terminal, wherein a switching signal is received at the switching control terminal, the method comprising:
switching an accelerating element, comprising a resistance smaller than a resistance of the switching resistor, in parallel to the switching resistor under the control of an accelerating control signal upon switching of the switching transistor until a voltage at the control terminal of the switching transistor has reached a predetermined value,
wherein the accelerating control signal is generated depending on the switching signal received at the switching control terminal, such that the accelerating control signal switches on the accelerating element during a predetermined time period following a transition of the switching signal.

19. A switch, comprising:
a plurality of switching transistors connected in series;
a plurality of switching resistors, each of the switching resistors being associated with one of the plurality of switching transistors; and
a plurality of accelerating elements, each of the accelerating elements being associated with one of the switching resistors;
wherein one of the switching resistors is connected between a control terminal of the switching transistor to which the switching resistor is associated and a switching control terminal;
wherein one of the accelerating elements comprises a resistance smaller than a resistance of the switching resistors to which said accelerating element is associated, the accelerating elements being adapted to be connected in parallel to the switching resistors to which said accelerating element is associated upon switching of the switching transistors until a voltage at the control terminal of the switching transistors has reached a predetermined value; and
wherein the one of the accelerating elements comprises a plurality of accelerating transistors connected in series between the control terminal of the switching transistors and the switching control terminal, the control terminals of the plurality of accelerating transistors being adapted to receive an accelerating control signal.

20. The switch as claimed in claim 19, comprising:
an input terminal and an output terminal, wherein the plurality of switching transistors is connected between the input terminal and the output terminal;
a second switching transistor connected between the output terminal and a reference terminal with respect to channel terminals of the second switching transistor;
a second switching resistor connected between a control terminal of the second switching transistor and a second switching control terminal; and
a second accelerating element, comprising a resistance smaller than a resistance of the second switching resistor, the second accelerating element being adapted to be connected in parallel to the second switching resistor upon switching of the second switching transistor until a voltage of the control terminal at the control terminal of the second switching transistor has reached a predetermined value.

21. The switch as claimed in claim 20, comprising:
a plurality of second switching transistors;
a plurality of second switching resistors, each being associated with one of the plurality of second switching transistors; and
a plurality of second accelerating elements, each being associated with one of the plurality of second switching resistors.

22. The switch as claimed in claim 20, wherein the second switching transistor is adapted to be switched by a switching signal at the switching control terminal, and a second accelerating control signal is provided to connect the second accelerating element in parallel to the second switching resistor for a second predetermined period of time following a switching control signal transition between two states of the switching control signal.

23. The switch as claimed in claim 22, wherein the second predetermined period of time depends on an RC time constant of a circuit comprising the second switching transistor, the second switching resistor and the second accelerating element.

24. The switch as claimed in claim 22, wherein the switching control signal comprises a first signal state effecting a conductive state of the second switching transistor and a second signal state effecting a blocking state of the second switching transistor;
the second accelerating control signal comprises a first signal state connecting the second accelerating element in parallel to the second switching resistor during the second predetermined period of time following a transition of the switching control signal between the first and second states.

25. The switch as claimed in claim 24, wherein the second accelerating control signal is adapted to change to a second signal state disconnecting the second accelerating element from the second switching resistor responsive to an expiration of the second predetermined period of time.

* * * * *